US012772504B2

(12) United States Patent
Yang

(10) Patent No.: US 12,772,504 B2
(45) Date of Patent: Oct. 20, 2026

(54) SEMICONDUCTOR DEVICE AND METHOD FOR FABRICATING THE SAME

(71) Applicant: UNITED MICROELECTRONICS CORP., Hsin-Chu City (TW)

(72) Inventor: Po-Yu Yang, Hsinchu City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 607 days.

(21) Appl. No.: 17/993,983

(22) Filed: Nov. 24, 2022

(65) Prior Publication Data

US 2024/0145594 A1 May 2, 2024

(30) Foreign Application Priority Data

Oct. 28, 2022 (CN) ........................ 202211340382.3

(51) Int. Cl.
*H10D 30/69* (2025.01)
*H10D 30/01* (2025.01)
*H10D 30/62* (2025.01)
*H10D 64/01* (2025.01)

(52) U.S. Cl.
CPC ......... *H10D 30/795* (2025.01); *H10D 30/024* (2025.01); *H10D 30/6211* (2025.01); *H10D 64/017* (2025.01)

(58) Field of Classification Search
CPC ............... H10D 30/765; H10D 30/024; H10D 30/6211; H10D 30/792; H10D 64/017; H10D 84/0188
See application file for complete search history.

(56) References Cited

U.S. PATENT DOCUMENTS 9,349,837 B2 5/2016 Ching et al.
10,103,265 B1 * 10/2018 Lee ...................... H10D 30/795
2007/0221962 A1 9/2007 Ishizu
2008/0023769 A1 1/2008 Shin
2008/0303102 A1 * 12/2008 Liang .................. H10D 30/751 257/397
2014/0042499 A1 * 2/2014 Zhang ................ H10D 30/0221 257/E21.409
2015/0287780 A1 * 10/2015 Zhang .................. H10D 30/791 257/339
2017/0154823 A1 * 6/2017 Tseng ................ H10D 30/6211
2019/0172753 A1 * 6/2019 Lin ...................... H10D 30/024
2022/0262687 A1 * 8/2022 Huang ............... H10D 84/0158
2022/0406890 A1 * 12/2022 Zhang ................... H01L 21/762

FOREIGN PATENT DOCUMENTS

JP 2007-189070 A 7/2007

* cited by examiner

*Primary Examiner* — Britt Hanley
*Assistant Examiner* — Casey Paul Boatman
(74) *Attorney, Agent, or Firm* — Winston Hsu

(57) ABSTRACT

A method for fabricating semiconductor device includes the steps of first forming a shallow trench isolation (STI) in a substrate, forming a gate structure on the STI and the substrate, forming a patterned mask on the STI and the gate structure, performing an etching process to remove part of the STI for forming a first trench adjacent to one side of the gate structure and a second trench adjacent to another side of the gate structure, and then forming a contact etch stop layer (CESL) on the gate structure and into the first trench and the second trench.

9 Claims, 8 Drawing Sheets

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly, to a method of etching shallow trench isolation (STI) for forming trenches.

2. Description of the Prior Art

In current semiconductor industry, polysilicon has been widely used as a gap-filling material for fabricating gate electrode of metal-oxide-semiconductor (MOS) transistors. However, the conventional polysilicon gate also faced problems such as inferior performance due to boron penetration and unavoidable depletion effect which increases equivalent thickness of gate dielectric layer, reduces gate capacitance, and worsens driving force of the devices. In replacing polysilicon gates, work function metals have been developed to serve as a control electrode working in conjunction with high-K gate dielectric layers.

However, in current fabrication of high-k metal gate transistors, means for increasing tensile stress in the transverse direction for the devices have yet to be studied. Hence, how to improve the current process for increasing tensile stress in the transverse direction has become an important task in this field.

SUMMARY OF THE INVENTION

According to an embodiment of the present invention, a method for fabricating semiconductor device includes the steps of first forming a shallow trench isolation (STI) in a substrate, forming a gate structure on the STI and the substrate, forming a patterned mask on the STI and the gate structure, performing an etching process to remove part of the STI for forming a first trench adjacent to one side of the gate structure and a second trench adjacent to another side of the gate structure, and then forming a contact etch stop layer (CESL) on the gate structure and into the first trench and the second trench.

According to another aspect of the present invention, a semiconductor device includes a shallow trench isolation (STI) in a substrate, a gate structure on the STI and the substrate, a first trench in the STI adjacent to one side of the gate structure, and a contact etch stop layer (CESL) on the gate structure and in the first trench.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
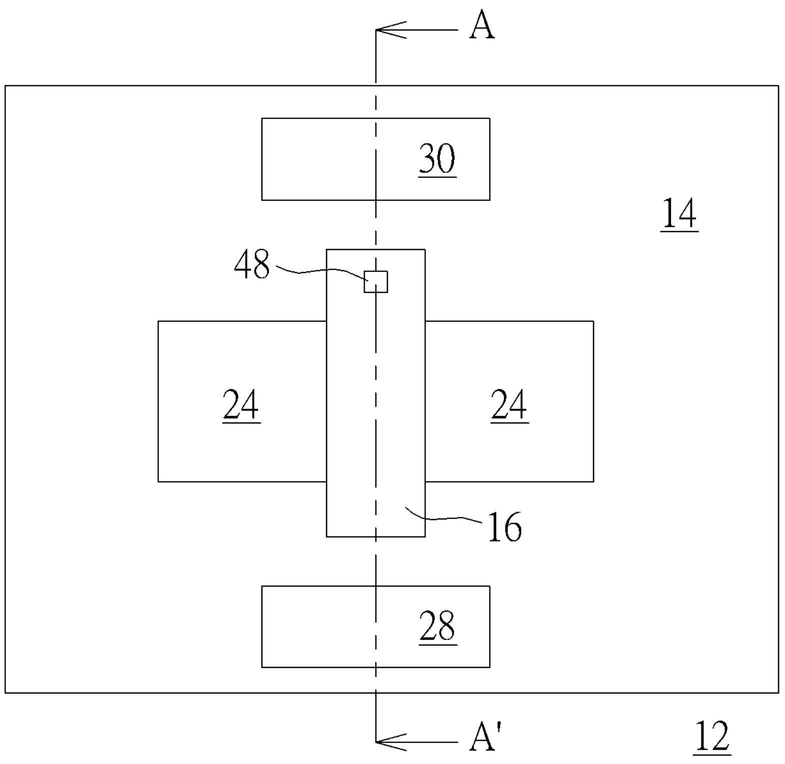
FIGS. 1-7 illustrate a method for fabricating a semiconductor device according to an embodiment of the present invention.

Referring to FIGS. 1-7, FIGS. 1-7 illustrate a method for fabricating a semiconductor device according to an embodiment of the present invention, in which FIG. 1 is a top view for fabricating the semiconductor device and FIGS. 2-7 are cross-section views for fabricating the semiconductor device taken along the sectional line AA' according to an embodiment of the present invention. It should be noted that FIGS. 2-7 are cross-section views taken along the extending direction of gate structure such that after the semiconductor device or MOS transistor is fabricated, element shown adjacent to two sides of the gate structure is a STI instead of a source/drain region.

Figure 2:
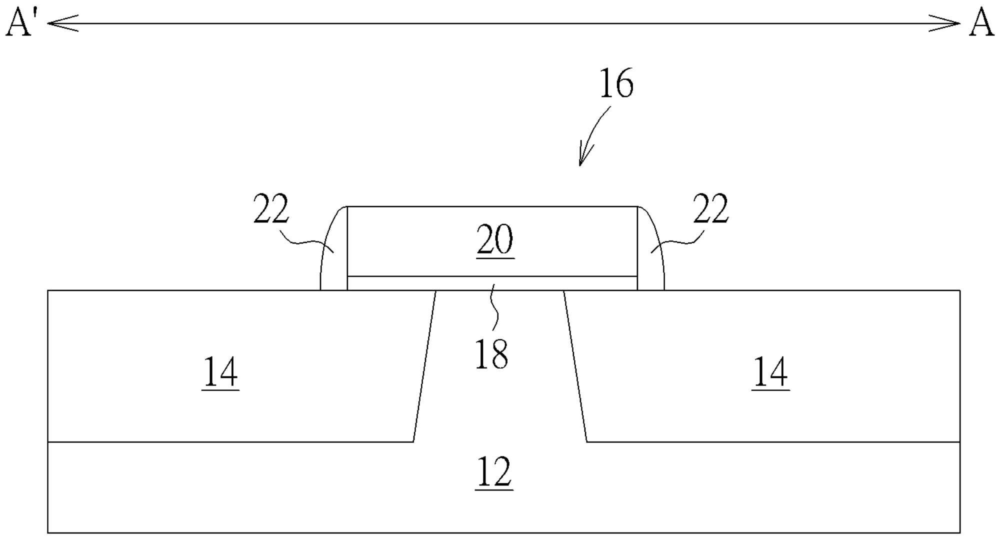

As shown in FIGS. 1-2, a substrate 12, such as a silicon substrate or silicon-on-insulator (SOI) substrate is provided, an active are could be defined on the substrate 12 for fabricating a field effect transistor (FET) or MOS transistor in the later process, and then part of the substrate 12 around the active area is removed and insulating material such as silicon oxide is deposited to form a STI 14. It should be noted that even though this embodiment pertains to fabricate a planar device, according to other embodiment of the present invention, it would also be desirable to apply the process of this embodiment to fabricate non-planar devices such as fin field effect transistors (FinFET), which is also within the scope of the present invention.

According to an embodiment of the present invention, if a FinFET were to be fabricated, the fin-shaped structure could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structure could also be obtained by first forming a patterned mask (not shown) on the substrate, 12, and through an etching process, the pattern of the patterned mask is transferred to the substrate 12 to form the fin-shaped structure. Moreover, the formation of the fin-shaped structure could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structure. These approaches for forming fin-shaped structure are all within the scope of the present invention.

Next, at least a dummy gate or gate structure 16 is formed on the substrate 12. In this embodiment, the formation of the gate structure 16 could be accomplished by sequentially depositing a gate dielectric layer 18, a gate material layer 20, and a selective hard mask (not shown) on the substrate 12, conducting a pattern transfer process by using a patterned resist (not shown) as mask to remove part of the gate material layer 20 and part of the gate dielectric layer 18, and then stripping the patterned resist to form a dummy gate or a gate structure 16 on the substrate 12. Each of the gate structure 16 preferably includes a patterned gate dielectric layer 18 and a patterned material layer 20, in which the gate dielectric layer 18 includes silicon oxide and the gate material layer 20 includes polysilicon, but not limited thereto.

Next, at least a spacer 22 is formed on sidewalls of the gate structure 16, a source/drain region 24 and/or epitaxial layer (not shown) is formed in the substrate 12 adjacent to two sides of the spacer 22, and a selective silicide (not shown) is formed on the surface of the source/drain region 24 and/or epitaxial layer. In this embodiment, the spacer 22 could be a single spacer or a composite spacer. For instance, the spacer 22 could further include an offset spacer (not shown) and a main spacer (not shown), and the spacer 22 could be selected from the group consisting of $SiO_2$, SiN, SiON, and SiCN. The source/drain region 24 and epitaxial layer could include different dopants or different material depending on the type of transistor being fabricated. For instance, the source/drain region 24 could include p-type or n-type dopants and the epitaxial layer could include SiGe, SiC, or SiP.

Figure 3:
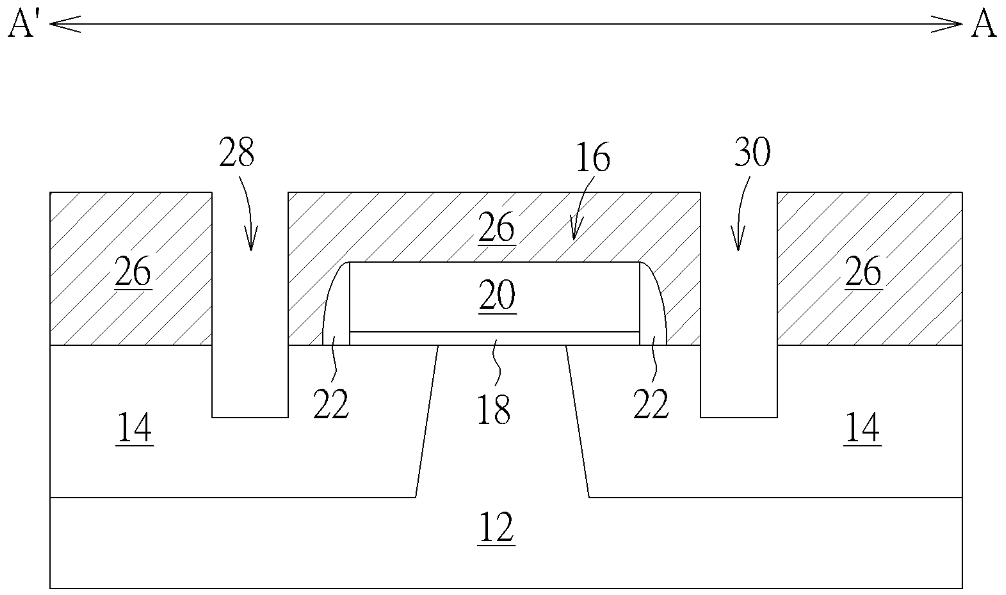

Next, as shown in FIG. 3, a patterned mask 26 is formed on the STI 14 and the gate structure 16, in which the patterned mask 26 includes openings (not shown) exposing part of the STI 14 surface adjacent to two sides of the gate structure 16. Next, an etching process is conducted by using the patterned mask 26 as mask to remove part of the STI 14 for forming a trench 28 adjacent to one side of the gate structure and another trench 30 adjacent to another aspect of the present invention.

Figure 4:
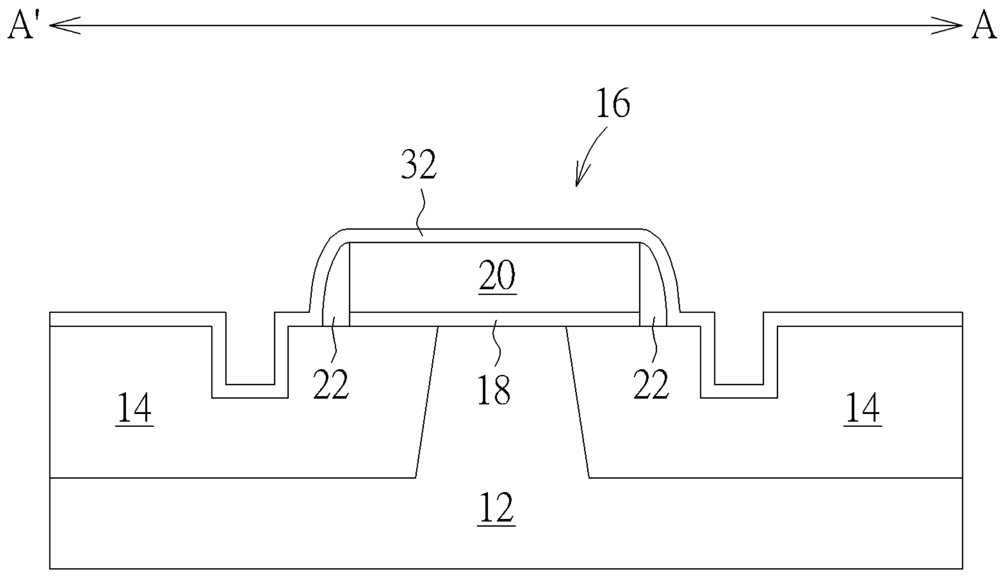

Next, as shown in FIG. 4, after removing the patterned mask 26, a contact etch stop layer (CESL) 32 is formed on the gate structure 16 and filled into the trenches 28, 30. Preferably, the CESL 32 is disposed on the surface of the gate structure 16 and the spacer 22 without filing the trenches 28, 30 completely. According to a preferred embodiment of the present invention, by forming trenches in the STI adjacent to two ends or two sides of the short axis ends of the gate structure and then forming a CESL in the trenches, it would be desirable to increase tensile stress and carrier transmitting speed on the transverse direction for both NMOS transistors and PMOS transistors.

Next, an interlayer dielectric (ILD) layer 34 is formed on the CESL 32 and a planarizing process such as a chemical mechanical polishing (CMP) process is conducted to remove part of the ILD layer 34 and part of the CESL 32 to expose the patterned material layer 20 made of polysilicon so the top surfaces of the patterned material layer 20 and ILD layer 34 are coplanar. In this embodiment, the CESL 32 could include silicon nitride while the ILD layer 34 could include silicon oxide, but not limited thereto.

Figure 6:
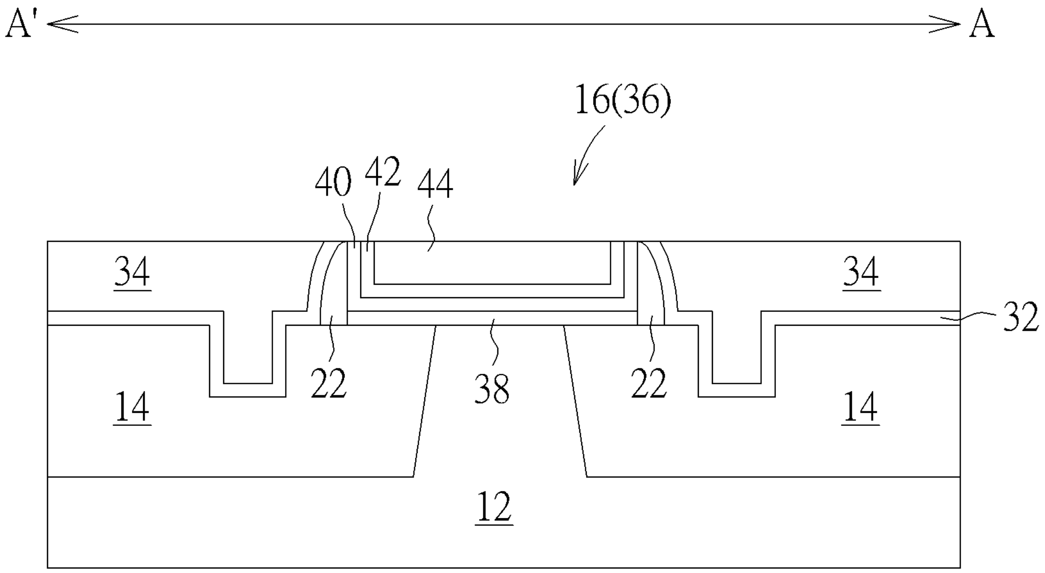

Next, as shown in FIG. 6, a replacement metal gate (RMG) process is conducted to transform the gate structure 16 into a metal gate 36. For instance, the RMG process could be accomplished by first performing a selective dry etching or wet etching process using etchants including but not limited to for example ammonium hydroxide ($NH_4OH$) or tetramethylammonium hydroxide (TMAH) to remove the gate material layer 20 and even the gate dielectric layer 18 for forming a recess (not shown) in the ILD layer 34. Next, an interfacial layer 38, a high-k dielectric layer 40, a work function metal layer 42, and a low resistance metal layer 44 are formed in the recess, and a planarizing process such as CMP is conducted to remove part of low resistance metal layer 44, part of work function metal layer 42, and part of high-k dielectric layer 40 to form metal gate 36. In this embodiment, the gate structure or metal gate 36 fabricated through high-k last process of a gate last process preferably includes an interfacial layer 38 or gate dielectric layer, a U-shaped high-k dielectric layer 40, a U-shaped work function metal layer 42, and a low resistance metal layer 44. According to an embodiment of the present invention, part of the low resistance metal layer 44, part of the work function metal layer 42, and part of the high-k dielectric layer 40 could be removed thereafter to form a recess, a hard mask (not shown) is formed in the recess, and a planarizing process such as CMP is conducted to remove part of the hard mask so that the top surfaces of the hard mask and ILD layer 34 are coplanar, which is also within the scope of the present invention.

In this embodiment, the high-k dielectric layer 40 is preferably selected from dielectric materials having dielectric constant (k value) larger than 4. For instance, the high-k dielectric layer 48 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the work function metal layer 42 is formed for tuning the work function of the metal gate in accordance with the conductivity of the device. For an NMOS transistor, the work function metal layer 42 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 42 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 42 and the low resistance metal layer 44, in which the material of the barrier layer may include titanium (Ti), titanium nitride (TiN), tantalum (Ta) or tantalum nitride (TaN). Furthermore, the material of the low-resistance metal layer 44 may include copper (Cu), aluminum (Al), titanium aluminum (TiAl), cobalt tungsten phosphide (CoWP) or any combination thereof.

Figure 7:
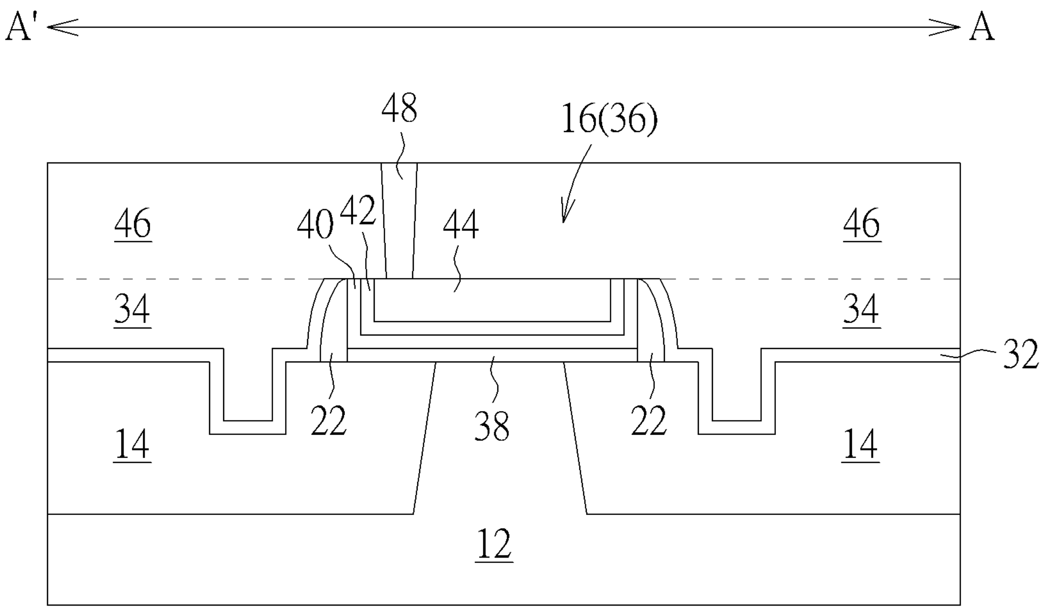

Next, as shown in FIG. 7, a contact plug formation could be conducted to form contact plugs 48 electrically connected to the source/drain region 24 and/or gate structure 16. In this embodiment, the formation of contact plugs 48 could be accomplished by first forming another ILD layer 46 made of silicon oxide on the ILD layer 34 and the metal gate 36, removing part of the ILD layer 34 and part of the CESL 32 to form contact holes (not shown), and then depositing a barrier layer (not shown) and a metal layer into the contact holes. A planarizing process, such as CMP is then conducted to remove part of the metal layer, part of the barrier layer, and even part of the ILD layer 46 to form contact plugs 48, in which the top surface of the contact plugs 48 is even with the top surface of the ILD layer 46. In this embodiment, the barrier layer is selected from the group consisting of Ti, Ta, TiN, TaN, and WN, and the metal layer is selected from the group consisting of Al, Ti, Ta, W, Nb, Mo, and Cu. This completes the fabrication of a semiconductor device according to an embodiment of the present invention.

Figure 8:
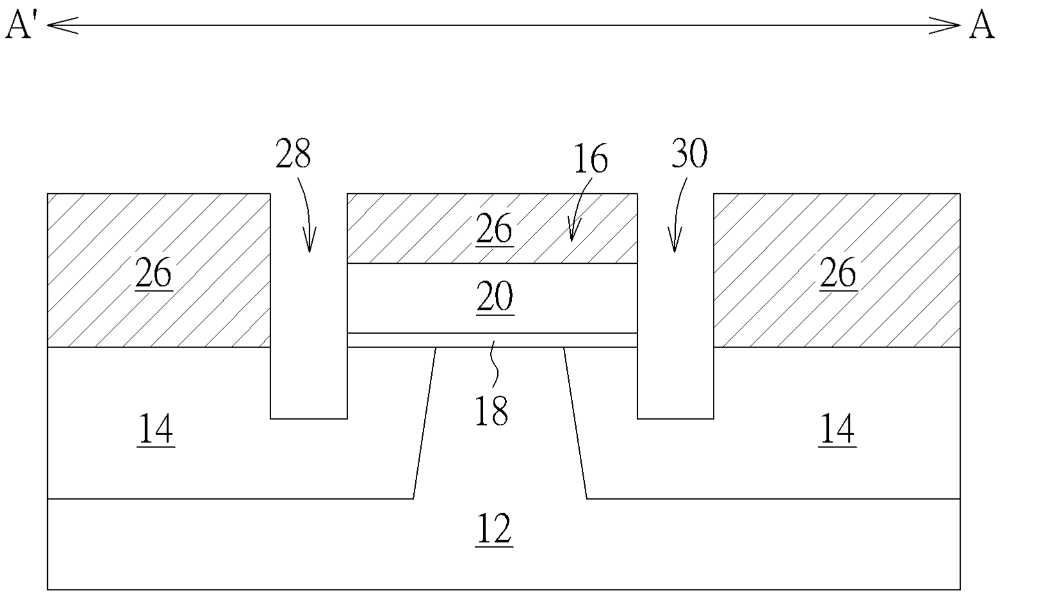
FIGS. 8-10 illustrate a method for fabricating a semiconductor device according to an embodiment of the present invention.
Figure 9:
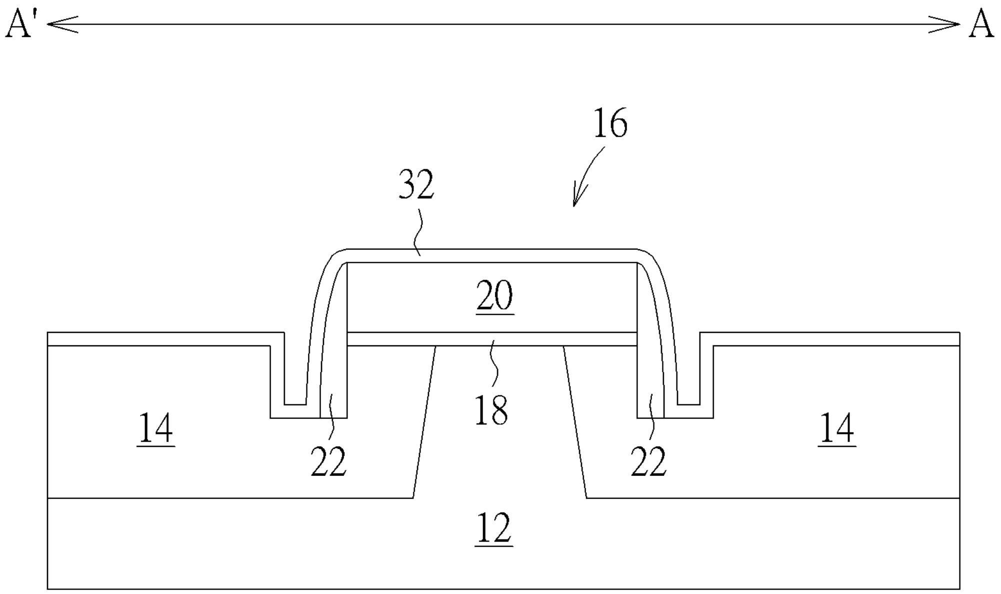
Figure 10:
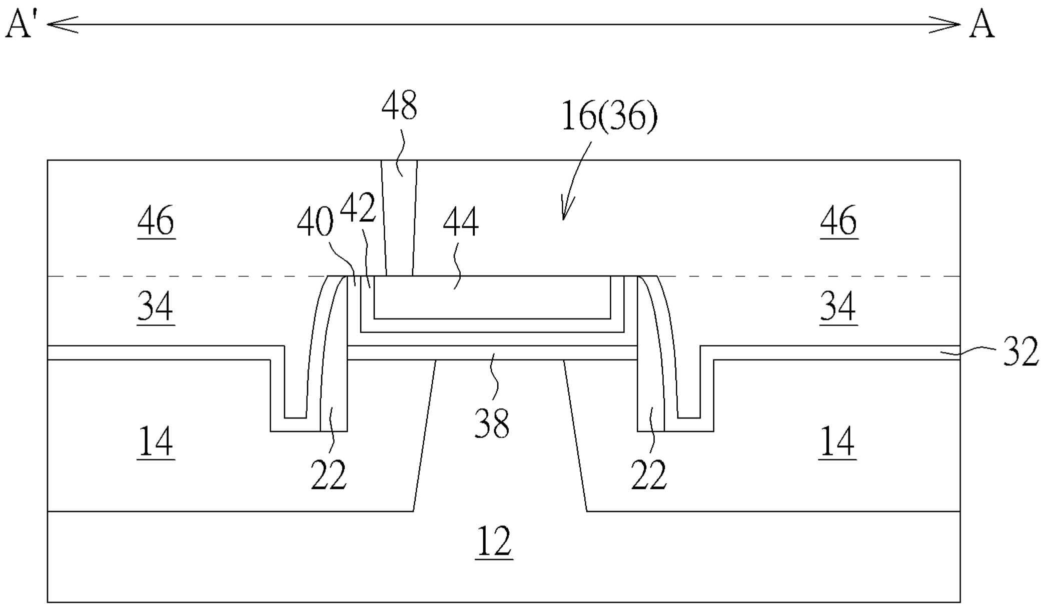

Referring to FIGS. 8-10, FIGS. 8-10 illustrate a method for fabricating a semiconductor device according to an embodiment of the present invention. As shown in FIG. 8, it would be desirable to first follow the steps disclosed in FIGS. 1-2 by forming a STI 14 in the substrate 12 and a gate structure 16 on the STI 14 and the substrate 12. Nevertheless, no spacer is formed at this stage as a patterned mask 26 is formed on the substrate 12 to cover the gate structure 16 and the STI 14, in which the edges of the patterned mask 26 are aligned with edges of the gate structure 16 while the patterned mask 26 includes opening exposing surface of the STI 14 adjacent to two sides of the gate structure 16. Next, an etching process is conducted by using the patterned mask 26 as mask to remove part of the STI 14 for forming a trench 28 adjacent to one side of the gate structure 16 and another trench 30 adjacent to another side of the gate structure 16.

Next, as shown in FIG. 9, after removing the patterned mask 26, at least a spacer 22 is formed on sidewalls of the gate structure 16. It should be noted that since two trenches 28, 30 have already been formed in the STI 14 adjacent to two sides of the gate structure 16 before the formation of the spacer 22, the spacer 22 formed at this stage would not only be disposed on sidewalls of the gate structure 16 but also be filled into the trenches 28, 30 so that the spacer 22 is disposed on sidewalls of the gate structure 16 and sidewalls of the STI 14 directly under the gate structure 16 at the same time. Preferably, sidewall of each spacer 22 directly contacting sidewall of the gate structure 16 is aligned with sidewall of each spacer 22 directly contacting sidewall of the STI 14 directly under the gate structure 16 and a bottom surface of each spacer 22 is lower than a top surface of the STI 14. Similar to the aforementioned embodiment, the spacer 22 could be a single spacer or a composite spacer. For instance, the spacer 22 could further include an offset spacer (not shown) and a main spacer (not shown), and the spacer 22 could be selected from the group consisting of $SiO_2$, SiN, SiON, and SiCN.

Next, a source/drain region 24 (not shown on the cross-section view of FIG. 9 taken along the sectional line AA') could be formed in the substrate 12 adjacent to two sides of the spacer 22 and then a CESL 32 is formed on the gate structure 16 and filled into the trenches 28, 30. Preferably, the CESL 32 is deposited to cover the surface of the gate structure 16 and the spacer 22 without filing the trenches 28, 30 completely. It should be noted that even though the CESL 32 in this embodiment and the aforementioned embodiment is deposited without filling the trenches 28, 30 completely, according to other embodiment of the present invention, it would also be desirable to deposit a CESL 32 into the trenches 28, 30 and fill the trenches 28, 30 completely as the fabrication processes shown in FIGS. 1-7 and FIGS. 8-10 are conducted, which is also within the scope of the present invention.

Figure 5:
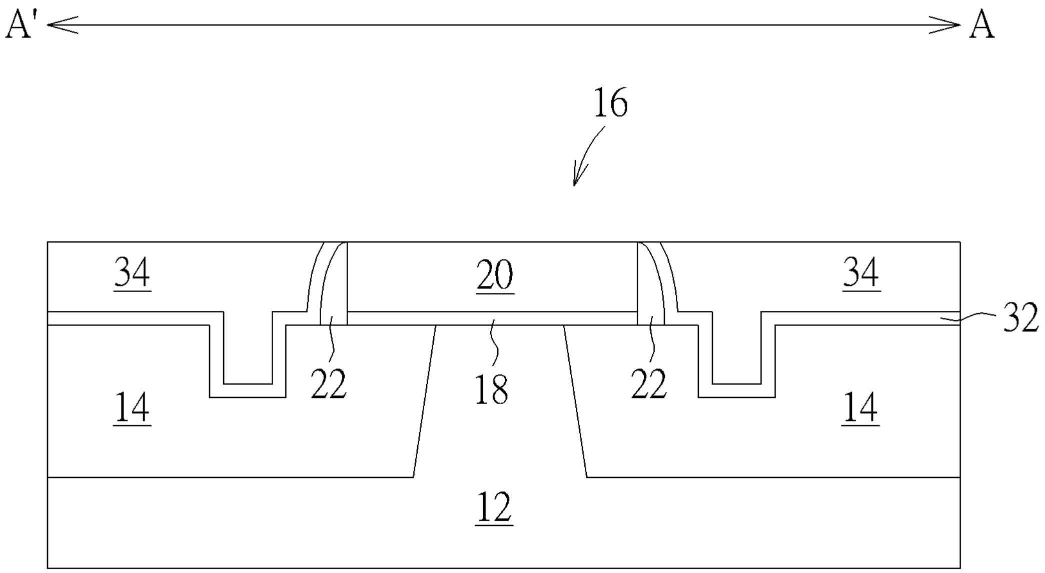

Next, as shown in FIG. 10, processes shown in FIGS. 5-7 could be carried out by forming an ILD layer 34 on the CESL 32, conducting a planarizing process such as a chemical mechanical polishing (CMP) process to remove part of the ILD layer 34 and part of the CESL 32 to expose the patterned material layer 20 made of polysilicon so the top surfaces of the patterned material layer 20 and ILD layer 34 are coplanar, performing a RMG process to transform the gate structure 16 into a metal gate 36, and then performing a contact plug formation to form another ILD layer 46 on the ILD layer 34 and metal gate 36 and contact plugs 48 in the ILD layer 46 to electrically connect the source/drain region 24 and/or the gate structure 16.

Figure 11:
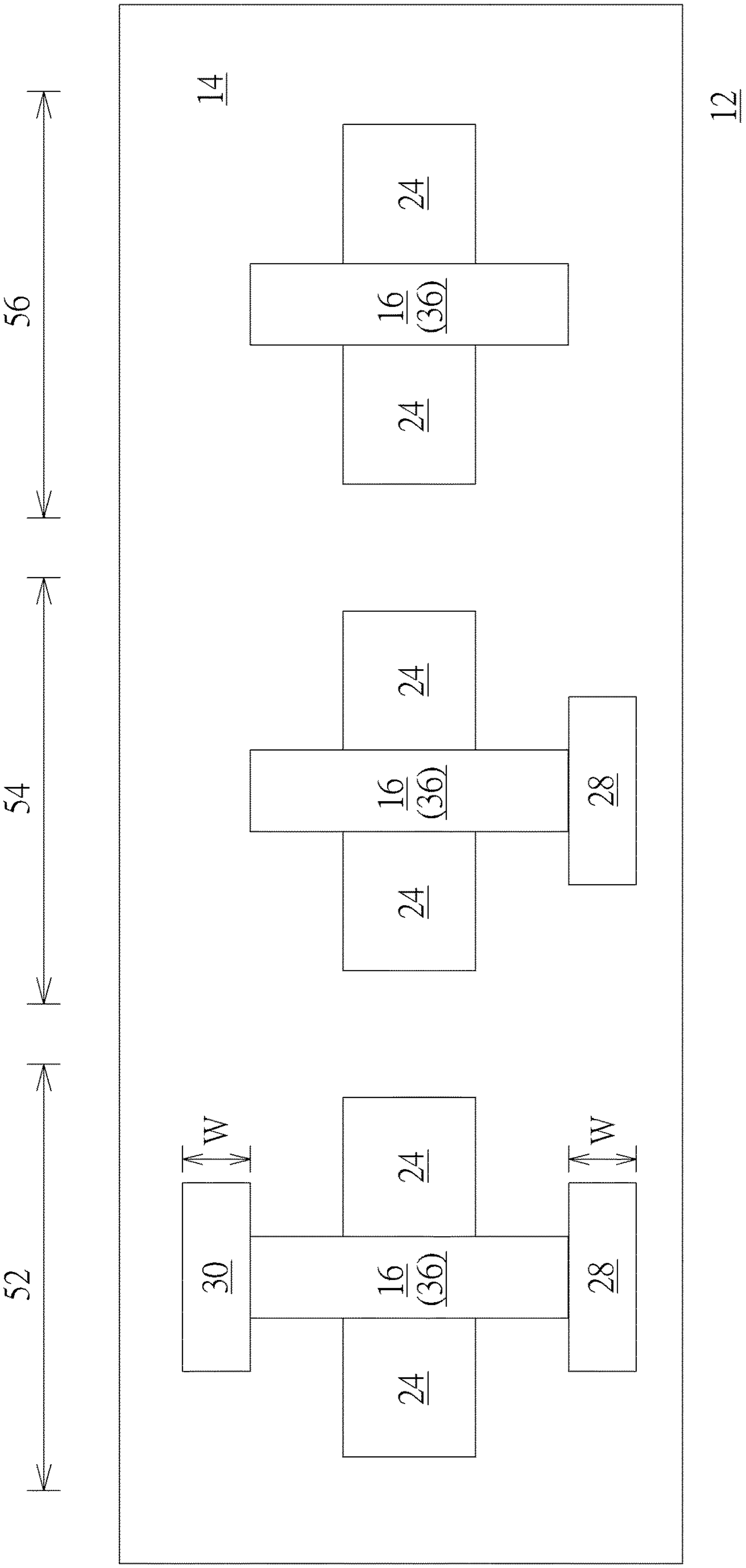
FIG. 11 illustrates a top view of a semiconductor device according to an embodiment of the present invention.

Referring to FIG. 11, FIG. 11 illustrates a top view of a semiconductor device according to an embodiment of the present invention. As shown in FIG. 11, it would be desirable to first define at least three regions including a low-voltage (LV) region 52, a medium-voltage (MV) region 54, and a high-voltage (HV) region 56 according to different threshold voltage of the device, in which the LV region 52 is defined for fabricating LV devices in the later process, the MV region 54 is defined for fabricating MV devices, and the HV region 56 is defined for fabricating HV devices. Preferably, active devices or field effect transistors fabricated through FIGS. 1-7 or FIGS. 8-10 are disposed on the regions 52, 54, 56 respectively, in which each of the field effect transistors include elements such as a gate structure 16 or metal gate 36, a source/drain region 24 disposed adjacent to two sides of extending direction or long-axis of the gate structure 16, and trenches 28 and 30 adjacent two sides of the two ends or two short-axes of the gate structure 16.

To achieve optimal balance for devices in different regions 52, 54, 56 corresponding to different voltage, the present invention preferably forms a trench 28 and a trench 30 adjacent to two ends or two short-axes of the gate structure 16 in the STI 14 of the LV region 52, a single trench such as trench 28 adjacent to one end or one short-axis of the gate structure 16 on the MV region 54, and no trench near two ends of the gate structure 16 on the HV region 56. It should be noted that since the edges of the trenches 28, 30 are aligned with the edges of the gate structure 16 as shown in the top view perspective of this embodiment, the structure if viewed from a cross-section perspective would correspond to the one disclosed in FIGS. 8-10 of the aforementioned embodiment.

Moreover, it would also be desirable to adjust the width W and/or depth (not labeled) of the trenches 28, 30 depending on the demand of the product. By increasing the width W and/or depth of the trenches 28, 30, the present invention is able to increase transverse strain of each transistor respectively. According to an embodiment of the present invention, the width W of each of the trenches 28, 30 is preferably between 0-0.64 μm and an etching ratio for the width W is between 0-0.8. The depth of each of the trenches 28, 30 is preferably between 20-200 nm and an etching ratio for the depth is between 0-0.4.

Figure 12:
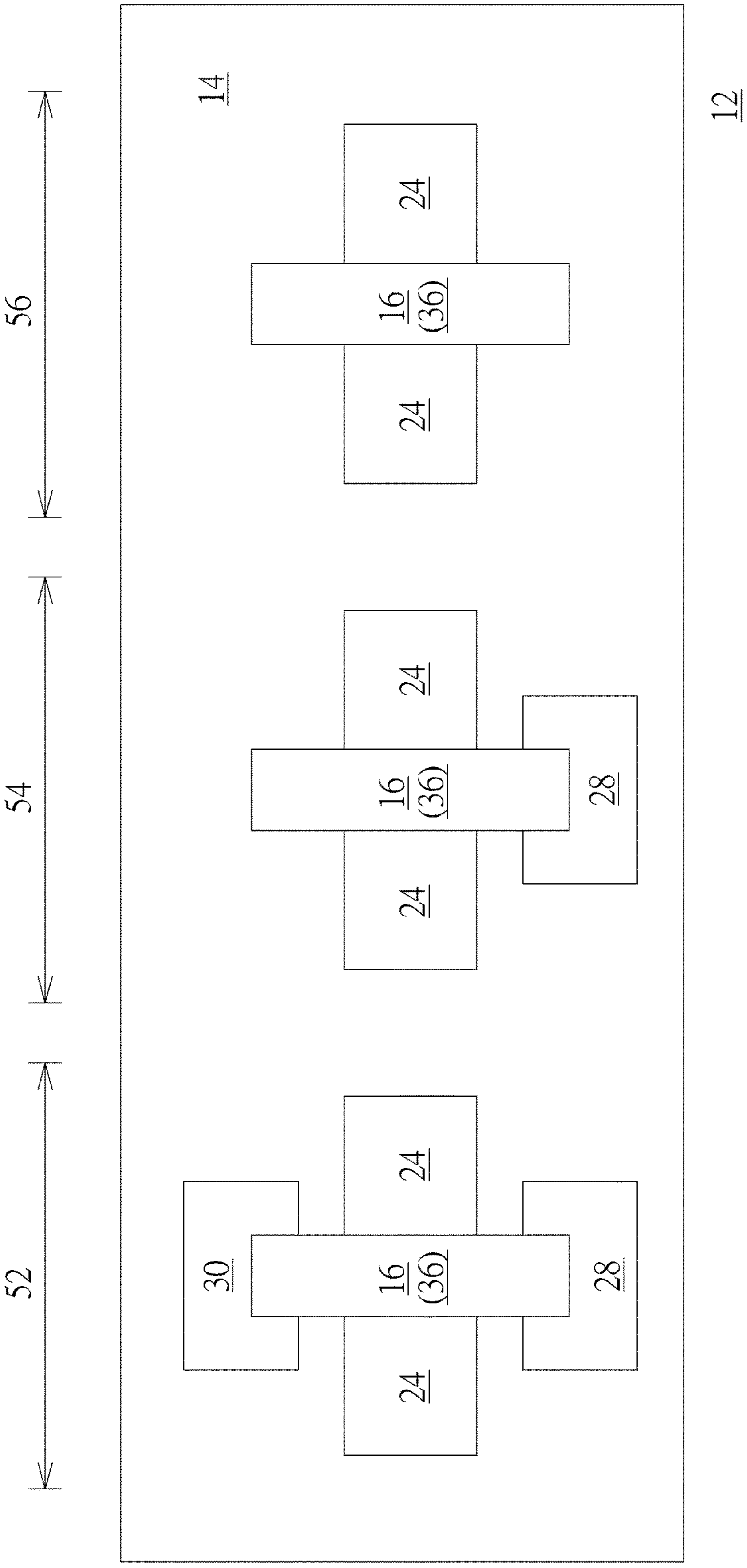
FIG. 12 illustrates a top view of a semiconductor device according to an embodiment of the present invention.

Referring to FIG. 12, FIG. 12 illustrates a top view of a semiconductor device according to an embodiment of the present invention. As shown in FIG. 12, in contrast to having edges of the trenches 28, 30 aligned with short ends or short axis ends of the gate structure 16 as shown in FIG. 11, it would also be desirable to extend the edges of the trenches 28, 30 slightly toward long sides or long axis sides of the gate structure 16 so that the trenches 28, 30 would surpass two ends of the gate structure 16 and directly contacting two long sides of the gate structure 16 while having a substantially U-shape if viewed from a top view perspective, which is also within the scope of the present invention.

Figure 13:
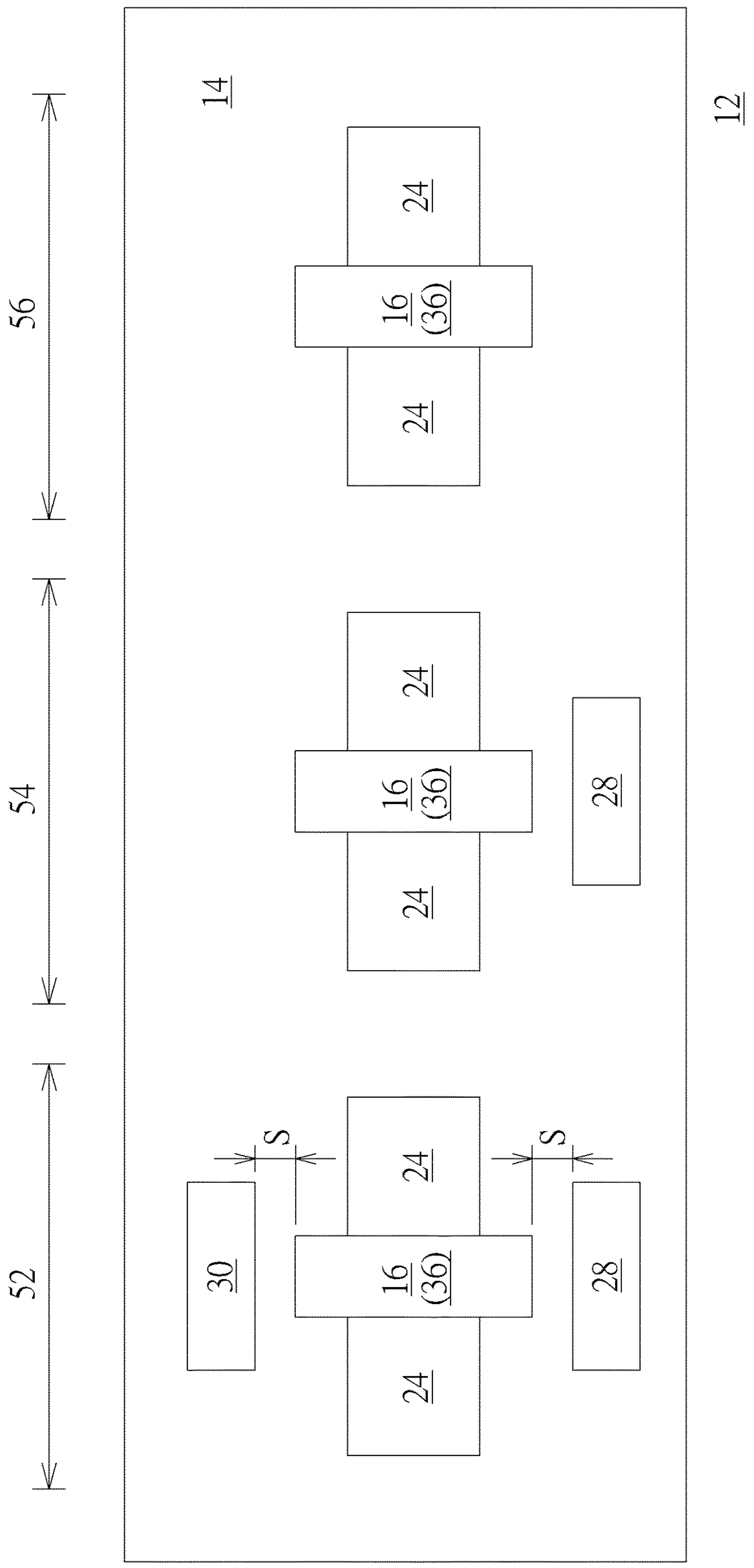
FIG. 13 illustrates a top view of a semiconductor device according to an embodiment of the present invention.

Referring to FIG. 13, FIG. 13 illustrates a top view of a semiconductor device according to an embodiment of the present invention. As shown in FIG. 13, it would be desirable to not only form a trench 28 and a trench 30 adjacent to two ends or two short-axes of the gate structure 16 in the STI 14 of the LV region 52, a single trench such as trench

28 adjacent to one end or one short-axis of the gate structure 16 on the MV region 54, and no trench near two ends of the gate structure 16 on the HV region 56, but also adjust the spacing S between the trenches 28, 30 and the gate structure 16 respectively. By increasing the spacing S between the trenches 28, 30 and the gate structure 16, the transverse strain for the transistor on each region could be increased respectively. It should be noted that since the edges of the trenches 28, 30 are not aligned with edges of the gate structures 16 instead having a spacing S between the trenches 28, 30 and the gate structure 16, the structure of this embodiment if viewed from a cross-section perspective would correspond to the one disclosed in FIGS. 1-7 of the aforementioned embodiment. According to an embodiment of the present invention, the spacing S is preferably between 0-0.5 μm, but not limited thereto.

Overall, the present invention first forms two trenches in the STI adjacent to two sides of the gate structure and then forms a CESL on the gate structure and into the two trenches. By using this approach to form trenches in the STI adjacent to two short ends of the gate structure and then deposit a CESL into the trenches, it would be desirable to increase tensile stress in the transverse direction for both NMOS and PMOS transistors thereby increasing transmission speed for the carriers.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor device, comprising:

forming a shallow trench isolation (STI) in a substrate;

forming a gate structure on the STI and the substrate, wherein a first end and a second end of the gate structure are directly on the STI;

forming a patterned mask on and directly contacting the STI and the gate structure;

forming a first trench in the STI adjacent to the gate structure; and forming a contact etch stop layer (CESL) on and directly contacting a top surface of the STI between the gate structure and the first trench and in the first trench.

2. The method of claim 1, further comprising:

forming a spacer around the gate structure;

forming the patterned mask on the STI and the gate structure;

using the patterned mask to form the first trench;

removing the patterned mask;

forming the CESL on the gate structure and in the first trench;

forming an interlayer dielectric (ILD) layer on the CESL;

planarizing the ILD layer; and performing a replacement metal gate (RMG) process to transform the gate structure into a metal gate.

3. The method of claim 2, wherein the patterned mask comprises an opening exposing the STI, the method comprising:

performing an etching process to remove the STI for forming the first trench adjacent to one side of the gate structure and a second trench adjacent to another side of the gate structure;

removing the patterned mask; and forming the CESL on the gate structure and in the first trench and the second trench.

4. The method of claim 1, further comprising:

forming a patterned mask on the STI and the gate structure;

using the patterned mask to form the first trench;

removing the patterned mask;

forming a spacer around the gate structure;

forming the CESL on the gate structure and the spacer;

forming an interlayer dielectric (ILD) layer on the CESL;

planarizing the ILD layer; and performing a replacement metal gate (RMG) process to transform the gate structure into a metal gate.

5. The method of claim 1, wherein a depth of the first trench is between 20-200 nm.

6. A semiconductor device, comprising:

a shallow trench isolation (STI) in a substrate;

a gate structure on the STI and the substrate, wherein a first end and a second end of the gate structure are directly on the STI;

a first trench in the STI adjacent to one side of the gate structure; and a contact etch stop layer (CESL) on and directly contacting a top surface of the STI between the gate structure and the first trench and in the first trench, wherein a bottom surface of the CESL between the gate structure and the first trench is even with a bottom surface of the gate structure.

7. The semiconductor device of claim 6, further comprising:

a spacer around the gate structure;

a second trench in the STI adjacent to another side of the gate structure;

the CESL on the spacer and in the first trench and the second trench; and an interlayer dielectric (ILD) layer on the CESL.

8. The semiconductor device of claim 6, further comprising:

a spacer adjacent to the gate structure and the STI under the gate structure;

a second trench in the STI adjacent to another side of the gate structure;

the CESL on the spacer and in the first trench and the second trench; and an interlayer dielectric (ILD) layer on the CESL.

9. The semiconductor device of claim 6, wherein a depth of the first trench is between 20-200 nm.

* * * * *